(12) United States Patent
Ye

(10) Patent No.: US 8,348,570 B2
(45) Date of Patent: Jan. 8, 2013

(54) MOUNTING APPARATUS FOR HEAT SINK AND FASTENING ASSEMBLY OF THE MOUNTING APPARATUS

(75) Inventor: Zhen-Xing Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 64 days.

(21) Appl. No.: 12/982,907

(22) Filed: Dec. 31, 2010

(65) Prior Publication Data

US 2012/0160976 A1    Jun. 28, 2012

(30) Foreign Application Priority Data

Dec. 23, 2010    (CN) .......................... 2010 1 0602343

(51) Int. Cl.
    *F16B 35/02*    (2006.01)
(52) U.S. Cl. ............. 411/383; 411/395; 361/704; 470/5
(58) Field of Classification Search ............... 248/224.8, 248/222.14, 354.3; 29/451, 525.01, 525.02, 29/525.11, 436; 411/383, 395, 8, 13, 14; 470/2, 5; 403/27; 24/DIG. 60
    See application file for complete search history.

(56) References Cited

U.S. PATENT DOCUMENTS

| | | | | |
|---|---|---|---|---|
| 1,199,690 A * | 9/1916 | Gillan | ............................ | 24/581.1 |
| 2,107,604 A * | 2/1938 | Friday | ............................ | 411/379 |
| 3,776,031 A * | 12/1973 | Trigg | ............................ | 116/225 |
| 3,891,127 A * | 6/1975 | Fernandez et al. | ............ | 222/387 |
| 4,364,155 A * | 12/1982 | Synowicki | ................... | 24/574.1 |
| 4,909,685 A * | 3/1990 | Hirst | ................................ | 411/9 |
| 5,336,028 A * | 8/1994 | Yamamoto | ................... | 411/107 |
| 5,337,637 A * | 8/1994 | Bih-Lien | ......................... | 81/439 |
| 5,459,909 A * | 10/1995 | Nussberger | .................. | 24/574.1 |
| 5,472,302 A * | 12/1995 | Yandle, II | ....................... | 411/14 |
| 6,135,661 A * | 10/2000 | Houser | ......................... | 401/195 |
| 6,233,770 B1 * | 5/2001 | Garcia | ............................ | 7/165 |
| 6,547,470 B2 * | 4/2003 | Legg | ............................ | 401/195 |
| 6,848,288 B1 * | 2/2005 | Derman | ........................ | 70/459 |
| 6,986,293 B2 * | 1/2006 | Dukart | ..................... | 73/862.391 |
| 7,296,316 B1 * | 11/2007 | Wu | ................................ | 7/158 |
| 7,994,901 B2 * | 8/2011 | Malis et al. | ............... | 340/426.33 |

* cited by examiner

*Primary Examiner* — Terrell McKinnon
*Assistant Examiner* — Daniel J Breslin
(74) *Attorney, Agent, or Firm* — Altis Law Group, Inc.

(57)    ABSTRACT

A fastening assembly includes a connecting member, a mounting member mounted to the connecting member, and a sliding member. The mounting member includes a first fixing portion. The sliding member is slidably received in the mounting member and the connecting member. The sliding member includes a first end exposed out of the first fixing portion, and a second end slidably received in the connecting member. The second end of the sliding member is operable to be extended out of or substantially coplanar with an end of the connecting member. The fastening assembly can be utilized to mount a heat sink to a board.

7 Claims, 4 Drawing Sheets

US 8,348,570 B2

MOUNTING APPARATUS FOR HEAT SINK AND FASTENING ASSEMBLY OF THE MOUNTING APPARATUS

BACKGROUND

1. Technical Field

The disclosure relates to a mounting apparatus for a heat sink.

2. Description of Related Art

Screws are widely used as threaded fasteners to hold objects together. For example, when assembling a computer case, a variety of different types of screws may be used to fasten system components, such as a motherboard, a hard disk drive, and a power supply, to the computer case. During assembly, the screws are used to fasten the components with tools, such as screwdrivers, but whether the components are firmly fastened by the screws cannot be determined. As a result, the components may disengage from each other if they are not firmly fastened, which will influence the function of the components.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
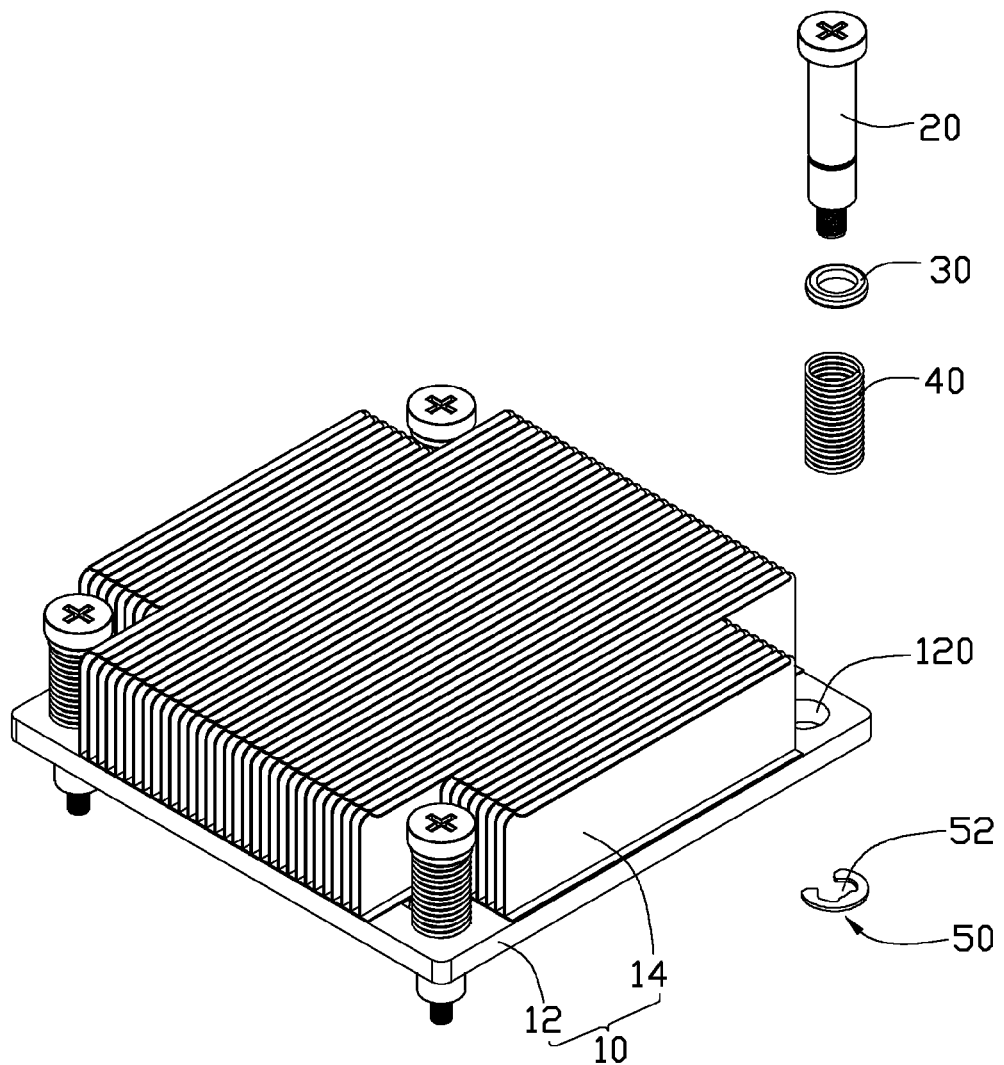
FIG. 1 is an exploded, isometric view of a mounting apparatus for a heat sink, the mounting apparatus includes a fastening assembly.

Referring to FIG. 1, a mounting apparatus is provided to mount a heat sink 10 to a board defining a plurality of blind holes mounted in an electronic device (not shown). The mounting apparatus includes a fastening assembly 20, a washer 30, a spring 40, and a C-clip 50.

The heat sink 10 includes a base 12, and a plurality of fins 14 substantially perpendicularly extending up from the base 12. The base 12 defines a through hole 120 in each corner of the base 12.

The C-clip 50 defines a clip hole 52, to grip the fastening assembly 20.

Figure 2:
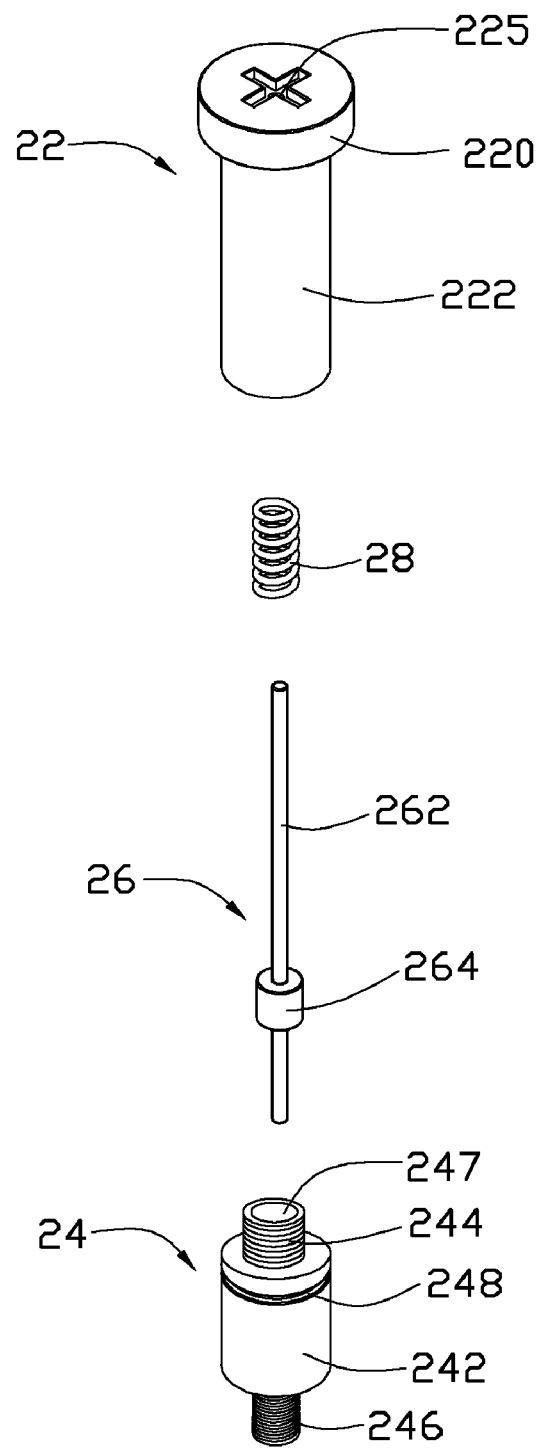
FIG. 2 is an exploded, isometric view of the fastening assembly of FIG. 1.
Figure 3:
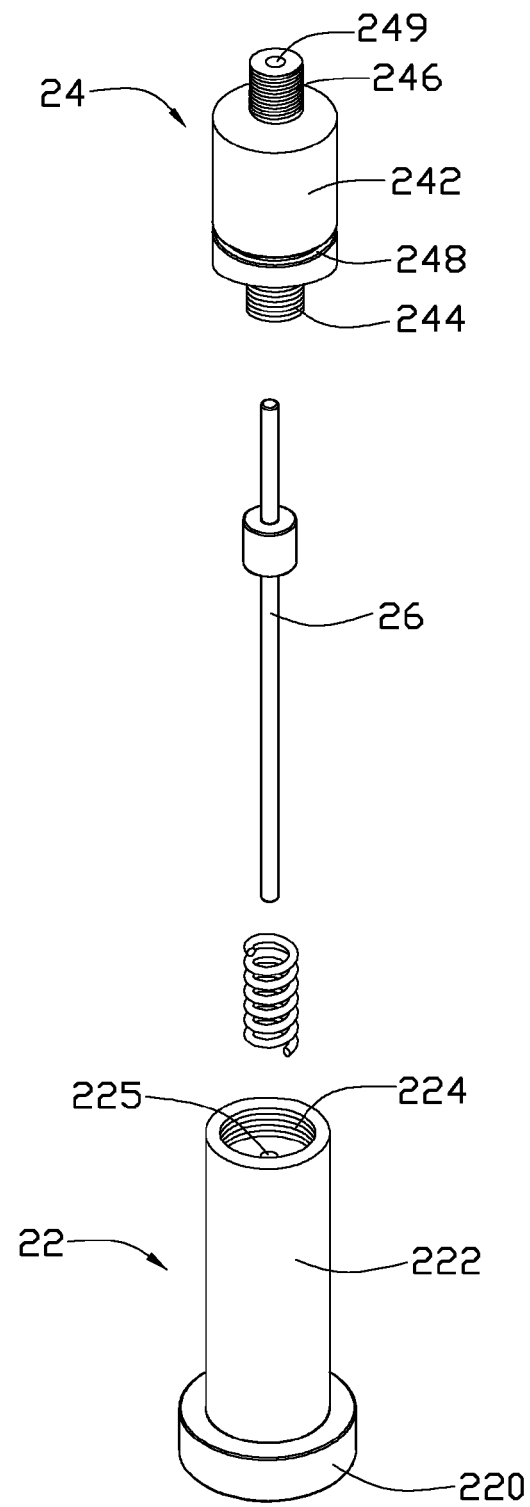
FIG. 3 is an inverted view of FIG. 2.
Figure 4:
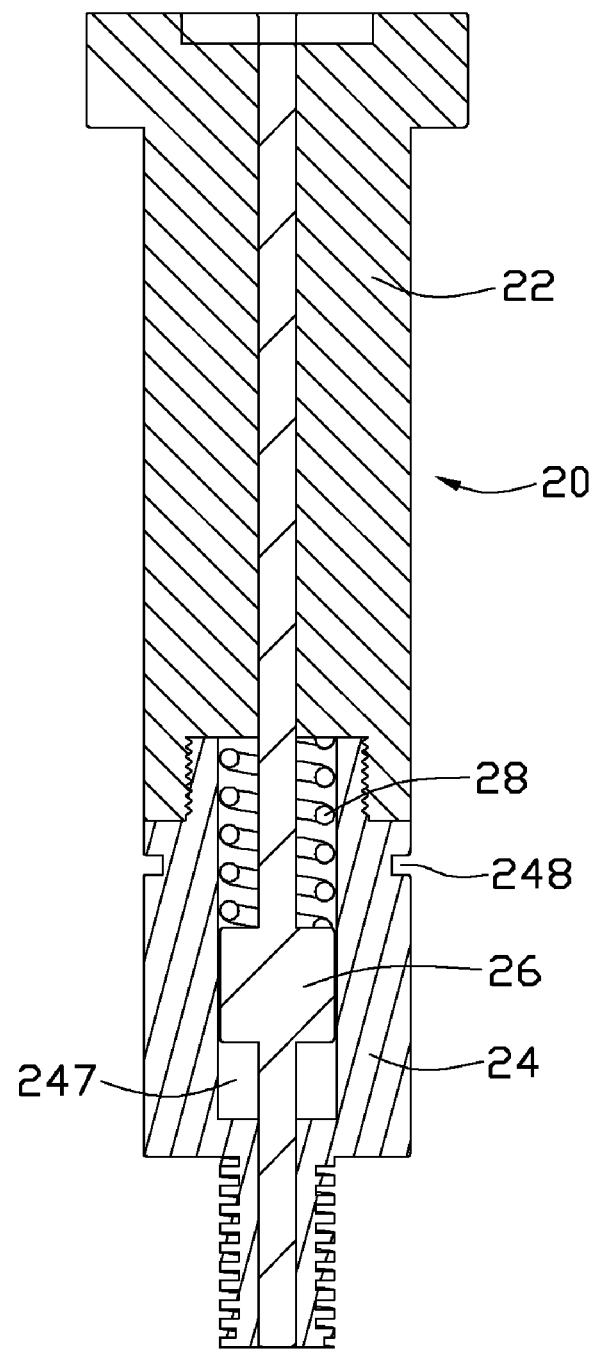
FIG. 4 is a cross-sectional view of the fastening assembly of FIG. 1.

Referring to FIGS. 2 to 4, the fastening assembly 20 includes a connecting member 22, a mounting member 24 mounted to the connecting member 22, a sliding member 26, and a resilient member 28 fitting about the sliding member 26. In this embodiment, the resilient member 28 is a coil spring.

The connecting member 22 includes a head 220, and a pole portion 222 extending from the head 220. A distal end of the pole portion 222 axially defines a threaded mounting slot 224, opposite to the head 220. The connecting member 22 axially defines a through hole 225 through the head 220 and the pole portion 222 communicating with the mounting slot 224. A diameter of the mounting slot 224 is larger than a diameter of the through hole 225.

The mounting member 24 includes a main body 242, a threaded first fixing portion 246 extending from a first end of the main body 246, and a threaded second fixing portion 244 extending from a second end of the main body 426 opposite to the first end. The main body 242 defines an annular slot 248 in a circumference of the main body 242. The main body 242 defines a receiving slot 247 extending through the second fixing portion 244. The first fixing portion 246 defines a sliding hole 249, extending to communicate with the receiving slot 247. A diameter of the receiving slot 247 is larger than a diameter of the sliding hole 249.

The sliding member 26 includes a shaft 262, and a resisting portion 264 protruding from a circumference of the shaft 262, adjacent to a first end of the shaft 262.

In assembling of the fastening assembly 20, the resilient member 28 fits about the shaft 262 of the sliding member 26, which is adjacent to a second end of the shaft 262 opposite to the first end of the shaft 262. The sliding member 26 together with the resilient member 28 are received in the receiving slot 247 of the mounting member 24, with the first end of the shaft 262 extending through the sliding hole 249 exposing out of the first fixing portion 246 of the mounting member 24. The resisting portion 264 of the sliding member 26 abuts against a bottom wall of the receiving slot 247 between the receiving slot 247 and the sliding hole 249. The second fixing portion 244 of the mounting member 24 is engaged in the mounting slot 224 of the connecting member 22, with the second end of the shaft 262 received in the through hole 225 of the connecting member 22. At this time, a first end of the resilient member 28 abuts against the resisting portion 264, and a second end of the resilient member 28 abuts against a bottom wall of the mounting slot 224 between the mounting slot 224 and the through hole 225.

Referring to FIG. 1 again, in assembling of the fastening assembly 20 to the heat sink 10, the washer 30 and the spring 40 fit about the pole portion 222 of the fastening assembly 20, with the washer 30 resisting against the head 220 of the fastening assembly 20. The pole portion 222 is extended through the through hole 120 of the heat sink 10, and the C-clip 50 engages in the slot 248 of the fastening assembly 20. Therefore, the fastening assembly 20 is mounted in the through hole 120. The C-clip 50 resists against a bottom of the base 12. Opposite ends of the spring 40 resist against the washer 30 and a top of the base 12. In assembling of the heat sink 10 to the board, the first fixing portion 246 of the fastening assembly 20 is screwed into the corresponding blind hole of the board. In this process, a bottom of the blind hole resists against the first end of the shaft 262 of the fastening assembly 20, therefore, the sliding member 26 of the fastening assembly 20 moves towards the head 220 of the fastening assembly 20. The resilient member 28 is deformed, so that opposite ends of the resilient member 28 elastically resist against the resisting portion 264 of the fastening assembly 20 and the bottom side bounding the mounting slot 224 of the fastening assembly 20. When the second end of the shaft 262 of the fastening assembly 20 extends out of or is substantially coplanar with the head 220 of the fastening assembly 20, the fastening assembly 20 is completely mounted to the board. Therefore, the heat sink 10 is mounted in the electronic device.

It is believed that the present embodiment and its advantages will be understood from the foregoing description, and it will be apparent that various changes may be made thereto without departing from the spirit and scope of the description or sacrificing all of their material advantages, the example hereinbefore described merely being exemplary embodiment.

What is claimed is:

1. A mounting apparatus for mounting a heat sink to a board defining a blind hole, the heat sink comprising a base defining a through hole, the mounting apparatus comprising:
   a fastening assembly comprising a connecting member extending through the through hole of the heat sink, a mounting member mounted to the connecting member, and a sliding member, a circumference of the mounting member defining a slot, the mounting member comprising a first fixing portion to mount the fastening assembly to the fastening, wherein the sliding member is slidably received in the mounting member and the connecting member, the sliding member comprises a first end to be exposed out of or withdrawn back into the first fixing portion; and
   a C-clip engaged in the slot of the mounting member and for resisting against a bottom of the base of the heat sink, wherein during assembly, the first end of the sliding member resists against a bottom wall of the blind hole of the board to drive the sliding member to move toward the connecting member, when a second end of the sliding member opposite to the first end extends out of or is coplanar with an end of the connecting member opposite to the mounting member, the fastening assembly is completely mounted to the board.

2. The mounting apparatus of claim 1, wherein the connecting member comprises a pole portion, the pole portion defines a mounting slot in a first end, the mounting member comprises a second fixing portion opposite to the first fixing portion, the second fixing portion is engaged in the mounting slot.

3. The mounting apparatus of claim 2, wherein the mounting member defines a receiving slot extending through the second fixing portion, the sliding member comprises a resisting portion slidably received in the receiving slot.

4. The mounting apparatus of claim 3, wherein the connecting member defines a through hole extending to communicate with the mounting slot, the mounting member defines a sliding hole extending to communicate with the receiving slot, the first and second ends of the sliding member extend through the sliding hole and the through hole of the connecting member respectively.

5. The mounting apparatus of claim 4, wherein the connecting member further comprises a head extending from a second end of the pole portion opposite to the mounting member, the through hole of the connecting member is defined in the head, and extends along the pole portion to communicate with the mounting slot, the second end of the sliding member is operable to be exposed or coplanar with the head.

6. The mounting apparatus of claim 5, wherein the fastening assembly further comprises a resilient member fitting around the sliding member from the second end of the sliding member, opposite ends of the resilient member resist against the resisting portion and a bottom wall bounding the mounting slot.

7. The mounting apparatus of claim 1, further comprising a spring, wherein the connecting member comprises a head and a pole portion extending from the head, the pole portion extends through the through hole of the base, the spring fits around the pole portion, and opposite ends of the spring resist against the head and a top of the base.

* * * * *